(12) United States Patent
Kawahara (10) Patent No.: US 7,864,297 B2
(45) Date of Patent: Jan. 4, 2011

(54) LIGHT BLOCKING DEVICE AND EXPOSURE APPARATUS

(75) Inventor: Nobuto Kawahara, Utsunomiya (JP)

(73) Assignee: Canon Kabushiki Kaisha, Tokyo (JP)

( * ) Notice: Subject to any disclaimer, the term of this patent is extended or adjusted under 35 U.S.C. 154(b) by 334 days.

(21) Appl. No.: 11/747,016

(22) Filed: May 10, 2007

(65) Prior Publication Data

US 2007/0268473 A1    Nov. 22, 2007

(30) Foreign Application Priority Data

May 17, 2006  (JP)  .............................. 2006-137684
May 9, 2007   (JP)  .............................. 2007-124689

(51) Int. Cl.
*G03B 27/54*  (2006.01)

(52) U.S. Cl. .............................. 355/71; 355/53; 355/67; 378/150; 378/152; 378/153

(58) Field of Classification Search .............. 250/505.1, 250/519.1; 355/53, 67, 69, 71; 359/230, 359/231; 378/34, 152, 153
See application file for complete search history.

(56) References Cited

U.S. PATENT DOCUMENTS

| | | | |
|---|---|---|---|
| 5,058,149 A * | 10/1991 | Vlasbloem | ............ 378/146 |
| 5,895,737 A | 4/1999 | McCullough et al. | ............ 430/30 |
| 5,966,202 A | 10/1999 | McCullough | ............ 355/67 |
| 6,013,401 A | 1/2000 | McCullough et al. | ............ 430/30 |
| 6,097,474 A | 8/2000 | McCullough et al. | ............ 355/69 |
| 6,292,255 B1 | 9/2001 | McCullough | ............ 355/67 |
| 2003/0063266 A1 * | 4/2003 | Leenders et al. | ............ 355/53 |
| 2005/0122502 A1 * | 6/2005 | Nemoto | ............ 355/69 |

FOREIGN PATENT DOCUMENTS

| JP | 5-215308 | 8/1993 |
|---|---|---|
| JP | 10-092727 | 4/1998 |
| JP | 10-340854 | 12/1998 |
| JP | 2000-082655 | 3/2000 |
| JP | 2001-035777 | 2/2001 |
| JP | 2001-244183 | 9/2001 |
| JP | 2002-184676 | 6/2002 |
| JP | 2006-049679 | 2/2006 |

OTHER PUBLICATIONS

Official Letter dated Feb. 4, 2009, issued in corresponding Korean patent application No. 10-2007-0046409.
Korean Office Action dated Apr. 14, 2008, issued in corresponding Korean patent application No. 10-2007-0046409.

* cited by examiner

*Primary Examiner*—Hung Henry Nguyen
*Assistant Examiner*—Colin Kreutzer
(74) *Attorney, Agent, or Firm*—Fitzpatrick, Cella, Harper & Scinto (57) ABSTRACT

A light blocking device includes a deformable member deformable in a first direction and elongating in a second direction intersecting with the first direction, a plurality of light blocking plates arrayed along the second direction, each of the plurality of light blocking plates being connected to the deformable member, so that adjoining blocking plates of the plurality of light blocking plates partly overlap with each other, and a plurality of actuators arrayed along the second direction and which cause deformation of the deformable member. At least one of the plurality of light blocking plates is tiltable independently from the other light blocking plates in response to deformation of the deformable member. A light blocking region is thereby defined, based on edges of the plurality of light blocking plates.

10 Claims, 9 Drawing Sheets

LIGHT BLOCKING DEVICE AND EXPOSURE APPARATUS

FIELD OF THE INVENTION AND RELATED ART

This invention relates to a light blocking device, and to an exposure apparatus using such a light blocking device to block a portion of light emitted from a light source.

Figure 10:
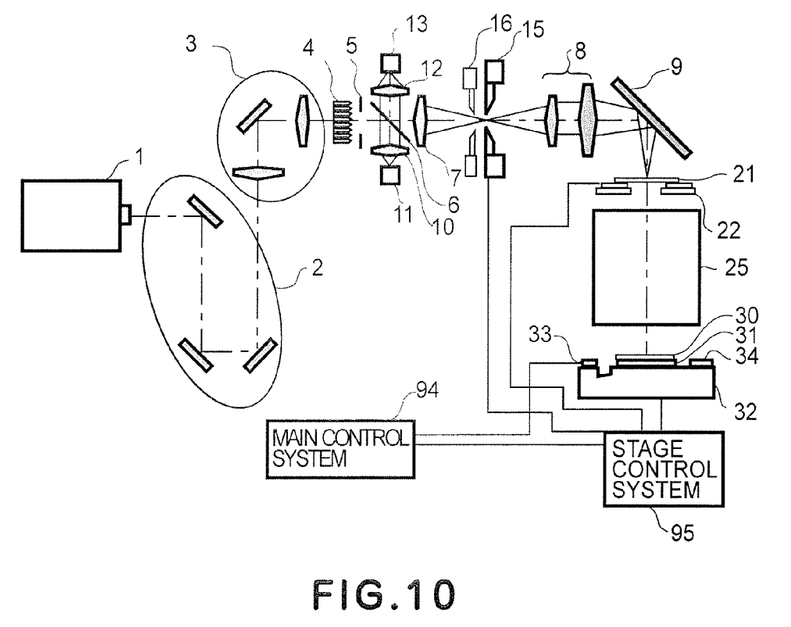
FIG. 10 is a schematic view of an exposure apparatus according to an embodiment of the present invention, showing one structural example.
Figure 11:
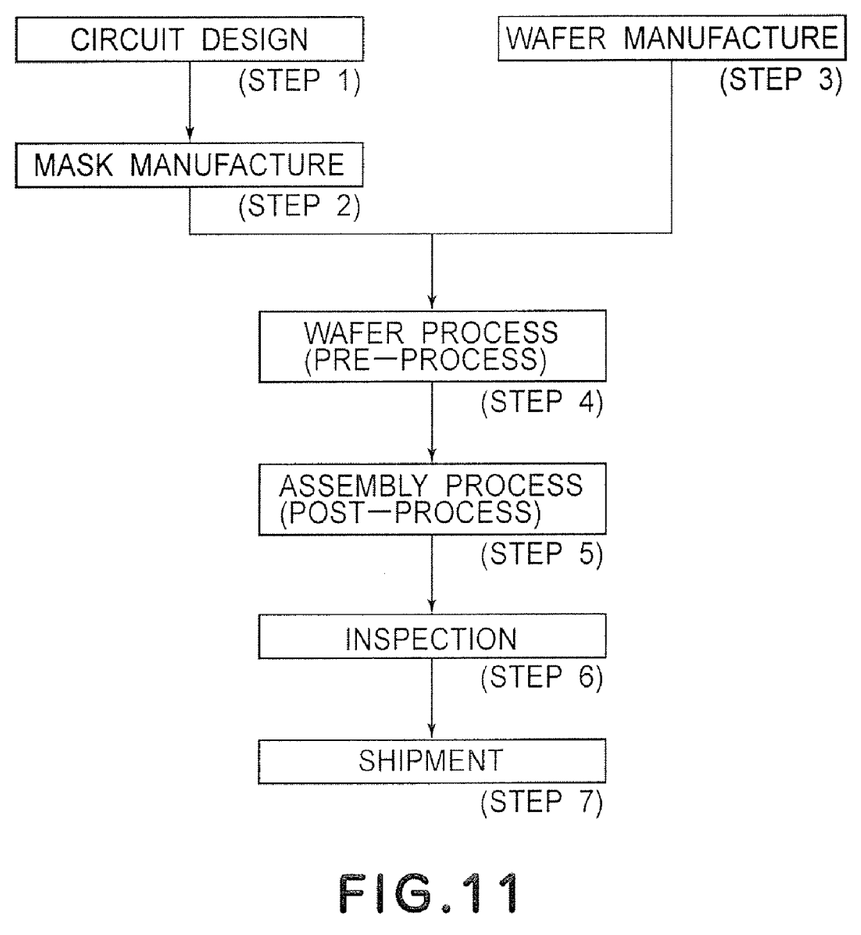
FIG. 11 is a flow chart for explaining an embodiment of a device manufacturing method using an exposure apparatus.
Figure 12:
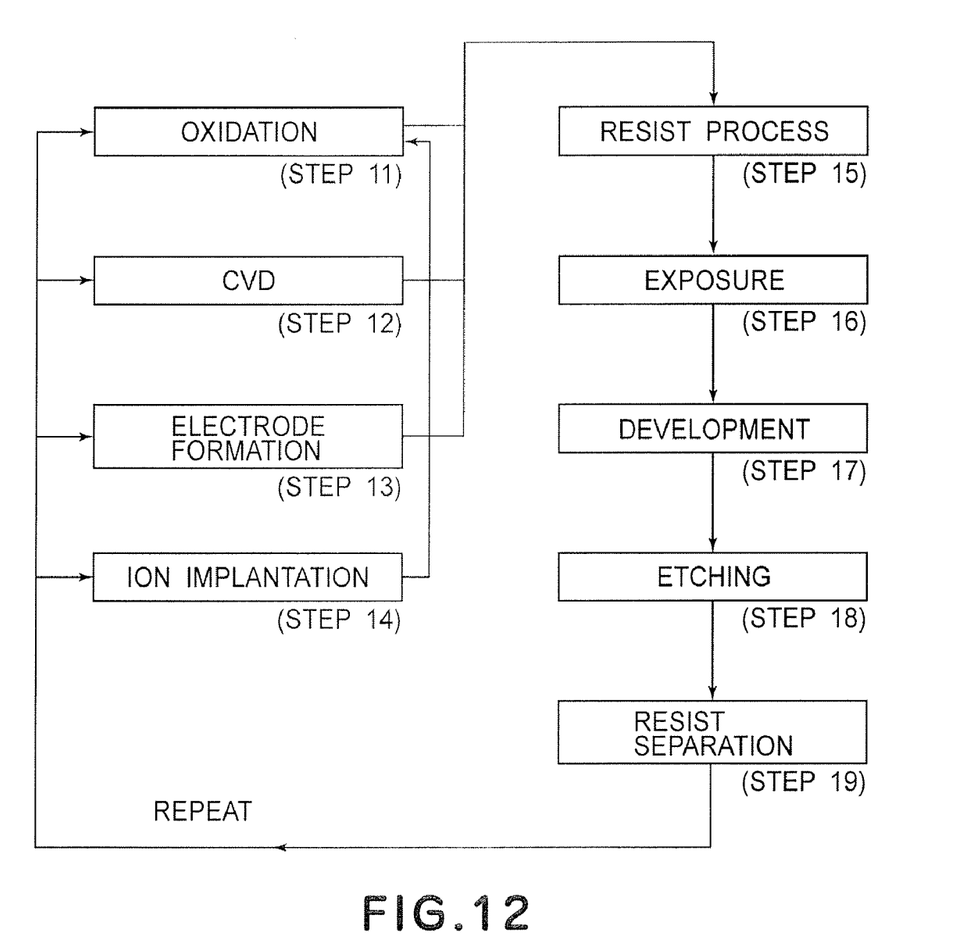
FIG. 12 is a flow chart for explaining details of a wafer process at step 4 in the flow chart of FIG. 11.

The basic structure of such a light blocking device used in an exposure apparatus, to which the present invention pertains, will be explained first in conjunction with FIG. 10, for convenience (actually, FIG. 10 shows an embodiment of the present invention to be described later). In FIG. 10, the light beam emitted from a light source 1 goes through a light path adjusting optical system 2 and an illumination shape adjusting optical system 3 by which the shape of the light beam is adjusted. Then, the light beam is directed to an optical integrator 4, by which the illuminance distribution of the light beam is averaged. Thereafter, the light beam goes through a first relay lens 7 and reaches a movable blind (variable field stop) 15 having two movable blades. The position of the movable blind 15 corresponds to the Fourier transform plane of the optical integrator 4, and this position is optically conjugate with the mask 21.

Disposed adjacent to the movable blind 15 is a light blocking device 16, which serves as a field stop. The light blocking device 16 has a function for intercepting a portion of the light beam, such that the light beam, as restricted by means of the movable blind 15 and the light blocking device 16, illuminates a region on the mask 21, through a second relay lens 8 and via a mirror 9. The light beam passing through the mask 21 is projected by a projection optical system 25 onto a wafer 30, by which a photoresist material applied onto the wafer surface is exposed and a pattern formed on the mask is transferred to the wafer.

During this exposure process, a mask stage and a wafer stage having the mask 21 and the wafer 30 carried thereon are scanningly and synchronously moved in a first direction (hereinafter, "scan direction"), which is parallel to the wafer 30 surface.

Here, in order that an image of the mask is transferred onto the wafer very precisely, the whole illumination region on the original has to be illuminated with uniform illuminance. Particularly, in recent years, because of a decreasing linewidth of patterns, it has been strongly desired to strictly control unevenness of the illuminance distribution (hereinafter, "illuminance non-uniformness") of illumination light at a highest precision.

Japanese Laid-Open Patent Application No. 2001-244183 and Japanese Laid-Open Patent Application No. 2002-184676 disclose a light blocking device with light blocking plate means for adjusting the illuminance non-uniformness. In these light blocking devices, light blocking plate means is used to locally change the area through which the illumination light passes. The illuminance adjustment is carried out in the manner that: at a region with higher illuminance, the light passing area is narrowed; whereas, at a region with lower illuminance, the light passing area is widened.

Figure 13:
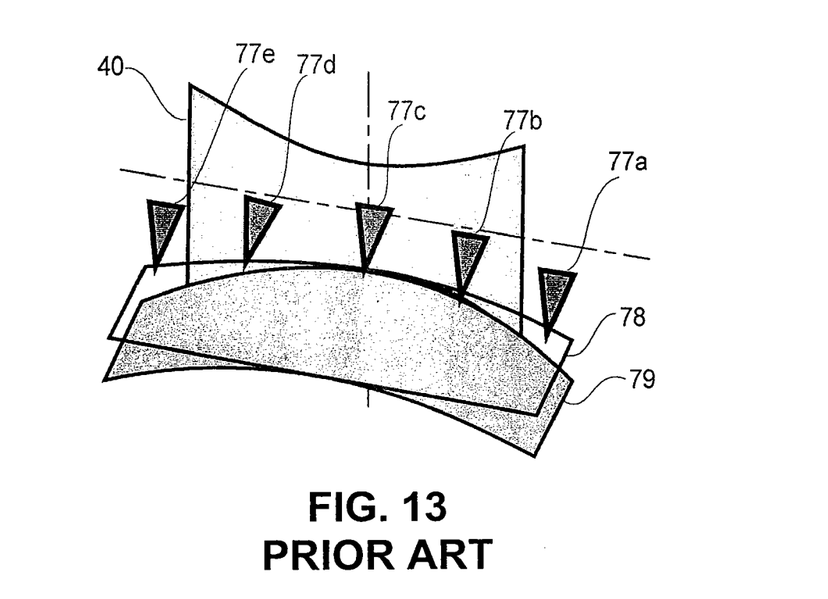
FIG. 13 is a schematic view for explaining a light blocking device disclosed in Japanese Laid-Open Patent Application No. 2001-244183.

Referring to FIG. 13, the light blocking device disclosed in Japanese Laid-Open Patent Application No. 2001-244183 will be explained in detail. There is a light blocking plate 78, which is inclined with respect to the optical axis, extending in a direction perpendicular to the sheet of the drawing. By pushing or pulling the light blocking plate 78 by use of push rods 77*a*, 77*b*, 77*c*, 77*d* and 77*e*, the light interception is controlled on the basis of the edge of the light blocking plate 78. In FIG. 13, the light blocking plate 78, after it is deformed, is illustrated therein as a light blocking plate 79.

Next, referring to FIG. 14, the light blocking device disclosed in Japanese Laid-Open Patent Application No. 2002-184676 will be explained in detail. There are a plurality of light blocking plates 120 and 120*b*, which are interconnected by rotatable linkage mechanisms. The linkage mechanisms are pushed and pulled by means of actuators 121 through a resilient member 123 and rod-like members 124 and 125, by which the edge shape as defined by the light blocking plates 120*a* and 120*b* is changed to adjust the interception of light.

In the light blocking device disclosed in Japanese Laid-Open Patent Application No. 2001-244183, since the light blocking region is defined by the edge of the light blocking plate being deformed, deformation of the very position where a force has been applied directly influences the light blocking region. For example, since the light blocking plate deforms steeply about the position where a force has been applied, it is difficult to shape the light blocking region with a gentle curve.

Furthermore, in Japanese Laid-Open Patent Application No. 2001-244183, since the light blocking plate is disposed at an incline with respect to the optical axis, the edge of the light blocking plate will be deformed also in the advancement direction of the light beam. This will cause a deviation or shift of the edge of the light blocking plate 79 from the plane defined by the movable blind 15 and being conjugate with the mask 21 (see FIG. 10 in this respect), in a direction causing image blur. Hence, it is difficult to predict the amount of illuminance non-uniformness correction that can be done through this light blocking device.

In the light blocking device disclosed in Japanese Laid-Open Patent Application No. 2002-184676, in order to change the shape of the resilient member 123 by elongation/contraction of the shafts 124, all the joints between the shaft 124 and the resilient member 123 and between the shaft 125 and the resilient member 123 should be made laterally displaceable as viewed in the drawing. Furthermore, since the light blocking plates are interconnected, it is difficult to determine the amount of movement of each light blocking plate on the basis of the movement amounts of the actuators. For these reasons, it is not easy to shape the light blocking region as desired.

SUMMARY OF THE INVENTION

The present invention removes or reduces at least one of the inconveniences described above.

The present invention in one aspect thereof enables easy adjustment of the light blocking region of a light blocking device.

Specifically, in accordance with an aspect of the present invention, there is provided a light blocking device, comprising a deformable member being deformable in a first direction, a plurality of light blocking plates connected to the deformable member and movable independently of each other, and an actuator configured to apply a force to the deformable member to change a light blocking region defined by the light blocking plates.

In accordance with another aspect of the present invention, there is provided an exposure apparatus, comprising an illumination optical system configured to illuminate an original with a slit-like light beam, a projection optical system configured to project an image of the original onto a substrate to be exposed, scanning means configured to relatively scan the original and the substrate relative to the illumination optical system and the projection optical system, and a light blocking device as discussed above and configured to change a shape of at least one of a leading edge and a trailing edge of the slit-like light beam with respect to a scan direction of the slit-like light beam.

In accordance with a further aspect of the present invention, there is provided a microdevice manufacturing method, comprising a step of exposing a substrate by use of an exposure apparatus as discussed above, and a step of developing the exposed substrate.

These and other objects, features and advantages of the present invention will become more apparent upon a consideration of the following description of the preferred embodiments of the present invention taken in conjunction with the accompanying drawings.

DESCRIPTION OF THE PREFERRED EMBODIMENTS

Preferred embodiments of the present invention will now be described with reference to the attached drawings.

First Embodiment

FIG. 10 is a schematic view of a general structure of a projection exposure apparatus having a light blocking device according to a first, exemplary embodiment of the present invention. Denoted in FIG. 10 at 1 is an excimer laser as a light source, and denoted at 2 and 3 are a light path adjusting optical system and an illumination shape adjusting optical system, respectively, for transmitting and shaping the light emitted from the laser. Denoted at 21 is a mask as an original, having a predetermined pattern formed thereon. Denoted at 25 is a projection optical system for projecting and transferring a pattern image of the mask 21 onto a wafer 30. Denoted at 32 is a wafer stage for moving and positioning the wafer 30. In this exposure apparatus, the mask 21 having a pattern formed thereon is illuminated with exposure light emitted from the excimer laser (light source) 1, and a portion of the pattern formed on the mask 21 is projected and transferred to the wafer 30. This exposure apparatus is structured as a scan type projection exposure apparatus wherein the mask 21 and the wafer 30 are synchronously scanned so that the pattern of the mask 21 is sequentially transferred to the wafer 30.

In recent projection exposure apparatuses, because of the increase of wafer size, enlargement of numerical aperture (NA) of exposure optical systems, or widening of the variety of functions added to the exposure apparatus, the size of the exposure apparatus itself is increasing. Similarly, because of the increase of laser output, band-narrowing of wavelength or addition of functions, the size of lasers (light sources) is increasing. In general, therefore, the major assemblies of an exposure apparatus and a laser 1 are disposed at independent set-up positions, respectively. In some cases, they are placed as different floors in the same factory building. Referring to FIG. 10, the excimer laser, which is a light source, is disposed at the floor different from the exposure apparatus major assembly, and the illumination light emitted from the laser 1 is directed through the light path adjusting optical system 2 into the exposure apparatus major assembly.

The light path adjusting optical system 2 shown in FIG. 10 is conveniently provided by a plurality of path-deflecting mirrors. More specifically, the light beam emitted from the laser 1 has an approximately rectangular sectional shape in a plane perpendicular to the optical path and, with respect to a horizontal direction and a vertical direction, it is diffused or contracted at different diffusion angles. The light path adjusting optical system functions, by using cylindrical lenses, not shown, to adjust this sectional shape and diffusion angles to desired ones. Furthermore, it has a function to detect any misalignment of the optical axis due to a setting error or relative floor vibration between the floor where the laser 1 is placed and the floor where the exposure apparatus main assembly is disposed, to adjust the position or mount angle of the deflecting mirrors or cylindrical lenses, thereby to correct the optical-axis misalignment.

The light beam directed into the exposure apparatus main assembly from the light path adjusting optical system 2 enters the illumination shape adjusting optical system 3 by which the light beam shape is adjusted, such that, upon the light entrance surface of an optical integrator 4, the light beam is just being imaged. Inside the illumination shape adjusting optical system 3, there is light beam adjusting means (not shown) including a combination of conical prisms, roof prisms, or pyramid prisms (all not shown) detachably mounted to adjust the light beam shape into a ring-like shape or to split the same into separate light beams. As an alternative example, the light beam adjusting means may include a combination of cylindrical lenses or toric lenses detachably mounted so as to provide a light beam shape having an aspect ratio adjusted in a plane approximately perpendicular to the optical axis of the light beam.

The light beam adjusting means is configured so that the interspacing of the structural components is adjustable such that the shape of the light beam to be produced is changeable continuously. Here, the light beam adjusting means as a whole should preferably be made telecentric on the light exit side, such that the light beam directed therefrom to the optical integrator 4 is focused on the light entrance surface of the integrator, through a lens system.

Generally, lasers used as a light source 1 have illuminance non-uniformness upon the plane at the light exit surface thereof, which differs with different devices or different machines. Furthermore, as the light beam passes through optical components of the light path adjusting optical system 2 or of the illumination shape adjusting optical system 3, further illuminance non-uniformness attributable to these optical components is added. As a result, the illuminance non-uniformness likely increases more inside the light path. In consideration of this, the optical integrator 4 is so structured that a plurality of small lenses are arrayed two-dimensionally with respect to the sectional-plane direction of the exposure light, and thus it has a function based on the superimposing (averaging) effect of image-plane illuminance, for producing what is called a "secondary light source" having reduced illuminance non-uniformness, adjacent to the light exit surface thereof.

Subsequently, the light beam from the secondary light source formed adjacent to the light exit surface of the optical integrator 4 is trimmed by an aperture stop 5, and it is more precisely shaped so that the beam shape is made into an exact one. The technique for making the beam shape of illumination light into a desired shape is known in the art as disclosed, for example, in Japanese Laid-Open Patent Application No. 05-215308 or Japanese Laid-Open Patent Application No. 2001-035777, and details of the optical component disposition will be omitted here.

Subsequently, the light beam passing through the aperture stop 5 is divided by a half mirror 6 into separate light paths. The half mirror 6 is coated with a semi-transparent film having a transmissivity of 95% or more, and most of the light beam passes therethrough. However, a portion of the light beam is reflected by this half mirror and is collected upon a light-quantity detecting sensor 11, whereby the output strength of the laser (light source) 1 can be measured. With regard to the sensor 11, a two-dimensional (area) sensor may be used as desired to detect the shape of the illumination region defined by the illumination shape adjusting optical system 3. In this embodiment, however, since the sensor is used just to detect the integrated light quantity in the illumination region as a whole, use of such a two-dimensional sensor is not indispensable. Different sensors may be interchangeably used to this end. The output of the laser 1 thus detected is signaled to a main control system, not shown, by which the output of the laser 1 or the emission pulse number thereof is adjusted, so that the illuminance (intensity) of the light beam is stabilized at a desired level.

On the other hand, the light beam passed through the half mirror 6 is imaged upon the movable blind 15 by means of a lens 7, and the light beam that passes through the opening area defined by the movable blind 15 goes to an imaging optical system 8. The movable blind 15 may have a structure such as disclosed in Japanese Laid-Open Patent Application No. 10-092727, for example. Hence, details of the same will be omitted here. However, it should be noted that the position of the movable blind 15 is at the Fourier transform plane of the optical integrator 4, and it is optically conjugate with the mask 21.

The imaging optical system 8 is an optical system for re-imaging the image of the movable blind 15 upon the mask 21.

With the structure described above, an image of the movable blind 15 is projected on the mask 21 placed on the mask stage 22, at a certain projection magnification R2. Then, the light beam passing through the mask 21 is projected by the projection optical system 25 onto the wafer 32, whereby the pattern formed on the mask 21 by chromium, for example, is imaged on and transferred to the wafer 30.

The structure having been described above is approximately the same regardless of whether the exposure apparatus is a simultaneous-exposure type projection exposure apparatus or a scan exposure type apparatus. However, if it is a scan exposure type projection exposure apparatus, then the mask 21 and the wafer 30 are placed on a mask stage 22 and a wafer stage 32, which are movable independently from each other along a plane approximately orthogonal to the optical axis of the light beam. In that case, the exposure is carried out by synchronously scanning the mask 21 and the wafer 30 with the light beam.

In such a scan exposure type projection exposure apparatus, the light beam passes across the mask 21 and the wafer 30 while being scanned in a certain direction (hereinafter, "scan direction"). As a result, even if the light beam has illuminance non-uniformness in the scan direction, since it is incident while being integrated, it has little influence on the transfer performance. However, with regard to the direction (hereinafter, "slit direction"), which is orthogonal to the scan direction, the photochemical reaction of the resist applied to the wafer 30 is largely influenced by the illuminance non-uniformness. Therefore, the illuminance non-uniformness in this direction must be removed precisely.

With regard to the illuminance non-uniformness adjusting method, there is a method in which an optical integrator, such as mentioned above or any other optical element, is used to superimpose the image plane illuminance. Another method is to insert an optical filter having a local transmissivity distribution into the light path to thereby forcibly remove the illuminance non-uniformness. However, although these methods may be effective for the illuminance non-uniformness, which occurs consistently, these cannot flexibly meet the illuminance non-uniformness which occurs due to a change of optical performance with respect to time or when the light source 1 is replaced by another, for example. Hence, illuminance non-uniformness adjusting means having a variable adjustment function is desired.

Figure 2:
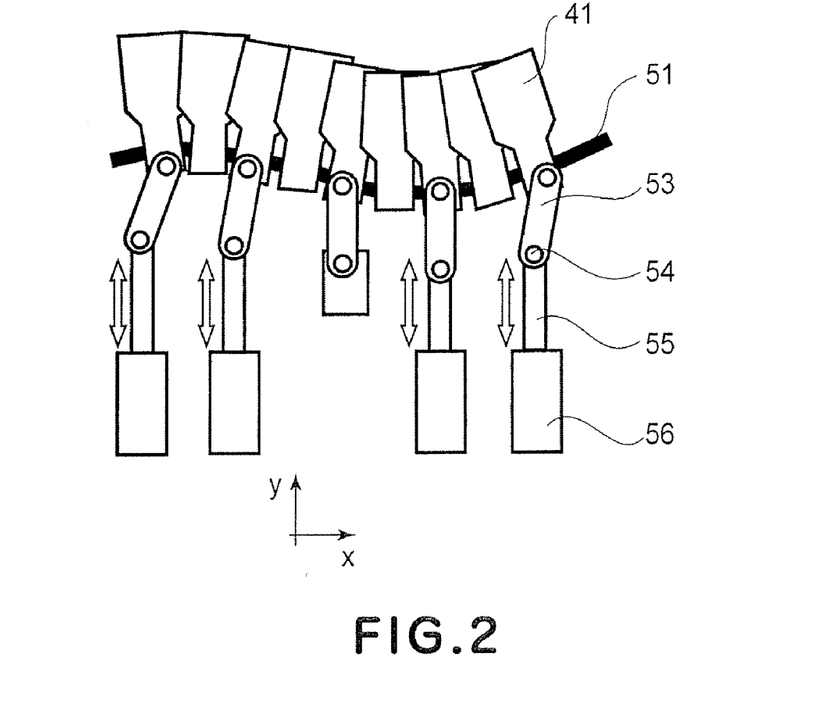
FIG. 2 is a schematic view for explaining the driving state of the light blocking device of FIG. 1.

The light blocking device of this embodiment can be suitably used as such illuminance non-uniformness adjusting means. The light blocking device as such may use light blocking plates to locally change the area through which illumination light passes. In a region with higher illuminance, the light passing area may be narrowed, while in a region with lower illuminance, the light passing area may be widened, thereby to adjust the illuminance non-uniformness. More specifically, the light blocking device may be disposed adjacent to the movable blind 15, as shown in FIG. 10, and it may comprise light blocking plates 41 disposed in a continuous array along the slit direction as shown in FIG. 2. Each of these light blocking plates 41 may be driven in the Y direction corresponding to the scan direction, to adjust the opening width with respect to the Y direction. In this manner, the illuminance non-uniformness, with respect to the slit direction, of the illumination light projected to the mask 21 and the wafer 30, can be adjusted.

Figure 9A:
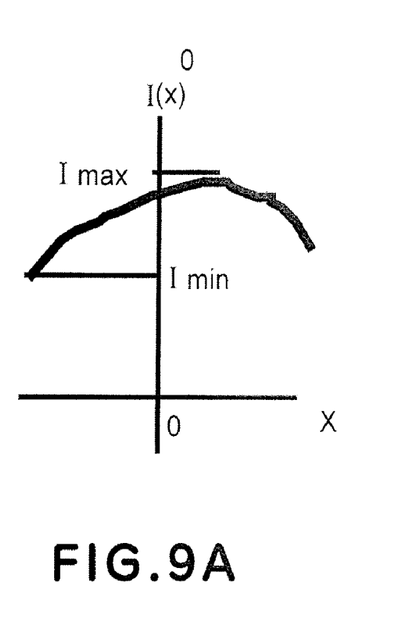
FIGS. 9A and 9B are schematic views for explaining the operation of a light blocking device in an exposure apparatus.
Figure 9B:
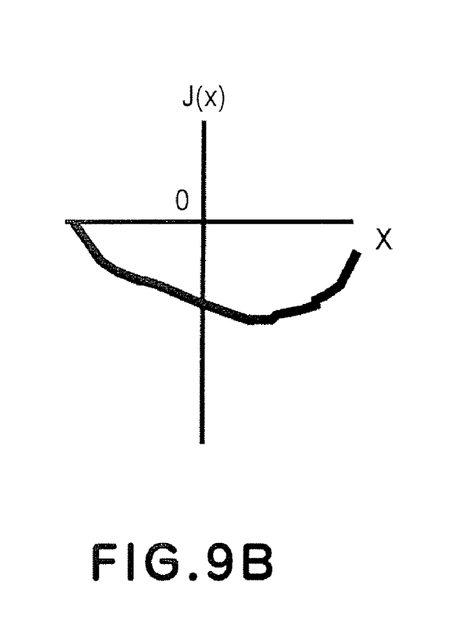

In such a light blocking device, within the illumination range on the movable blind 15, an illuminance non-uniformness curve I(x), such as shown in FIG. 9A, for example, may be measured. Subsequently, the edges of the light blocking plates 41 may be driven in accordance with a profile following a curve J(x) in FIG. 9B that corresponds to an inverse of the curve I(x), whereby the amount of illumination (dose) as determined by the product of illuminance and illumination time with respect to the scan direction, can be made uniform.

Figure 1:
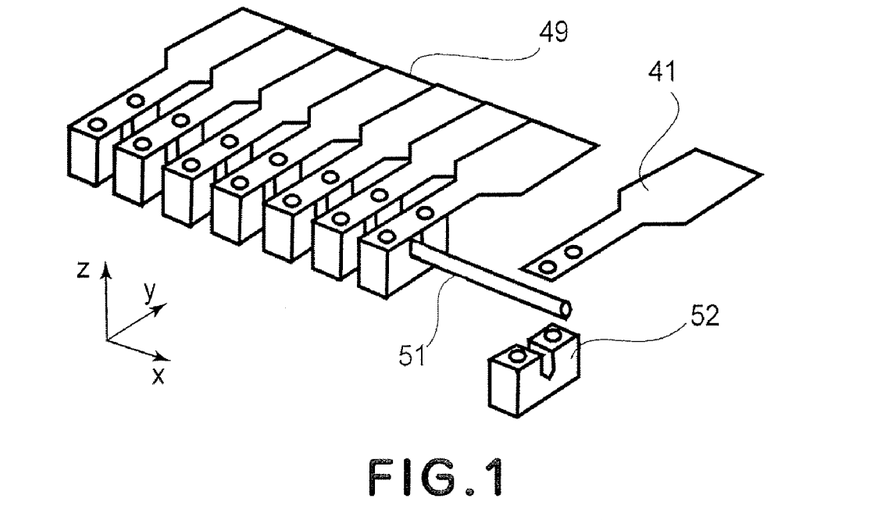
FIG. 1 is a schematic view for explaining the structure of a light blocking device according to a first embodiment of the present invention.

FIGS. 1 and 2 are schematic views, respectively, of a general structure of a light blocking device according to the first embodiment of the present invention. In these drawings, an axis, which is parallel to the optical axis to be light-intercepted is taken as the X axis, and two axes, which are orthogonal to each other within a plane perpendicular to the optical axis, are taken as the X and Y axes. The light blocking device 16 according to one preferred form of the present invention includes a wire (line material) 51, which is deformable at least in the Y direction (first direction), a plurality of light blocking plates 41 connected to the wire 51, and actuators 56 for applying a force to the wire to cause deformation of the same. The wire 51 and the light blocking plates 41 are disposed in a plane, which is substantially parallel to the X-Y plane. Each light blocking plate 41 is connected to the wire 51 through a clamp (connector) 52.

Each actuator 56 is connected to the wire 51 through a stay 55, a clamp 54 and another stay 53. The actuator 56 may be connected to the clamp 52 fixed to the wire 51. A plurality of actuators 56 are provided along the X direction and, by controlling these actuators, the shape of the wire 51 can be deformed as desired. Deformation of the wire 51 causes a change in the outer configuration of the light blocking region which is defined by the edges 49 of the light blocking plates 41. Here, the clamps 52 of adjoining light blocking plates are disposed with an interspace kept therebetween, to avoid contact between them. Furthermore, the light blocking plates are so disposed that the light blocking portions of adjoining light blocking plates partially overlap with each other when the wire 51 is not deformed (i.e., when kept straight). To this end, for example, the width of the edge 49 of each light blocking plate 41 may be made larger than the interspace between adjoining clamps, in the X direction. With this arrangement, no gap is formed between adjoining light blocking plates when the wire 51 is deformed, and the outer configuration of the light blocking region can be defined by substantially continuing curved lines and straight lines.

Each light blocking plate 41 is connected to a clamp 54 by screw means, for example. They are connected to each other so that a portion of the wire 51 is nipped in a recess of the clamp. As a result, if the tilt of the wire portion nipped by the clamp with respect to the X direction changes, it causes a change in the tilt of the edge 49 of the light blocking plate corresponding to this wire portion, with respect to the X direction. In this manner, the outer configuration of the light blocking region is defined while following the shape of the wire.

Here, these light blocking plates 41 are made movable independently of each other. Namely, the light blocking plates 41 are not interconnected with each other by means of a linkage, or the like, and hence, any motion of a single light blocking plate does not cause a shift of any other light blocking plates. Therefore, the outer configuration of the light blocking region can be shaped quite close to a desired shape.

As described above, in the light blocking device according to this embodiment, a plurality of light blocking plates are connected to a deformable wire element for independent motion from the others, and the light blocking region defined by the light blocking plates can be changed by deforming the wire by means of actuators. This enables high-precision positional adjustment of the outer configuration of the light blocking region, while reducing the adverse influence of local deformation of the wire upon the outer configuration of the light blocking region. Hence, illuminance non-uniformness of light projected on the wafer or reticle can be adjusted precisely by this. Furthermore, since this embodiment does not use a structure having plural linkage mechanisms, such as shown in FIG. 14, the light blocking device can be made compact.

In one preferred form of this embodiment, the light blocking surface of each light blocking plate 41 may be disposed perpendicularly to the optical axis. Furthermore, the actuator 56 may be configured to move the light blocking plate 41 in the direction along this surface. On that occasion, accidental contact of the edge 49 of the light blocking plate 41 with the movable blind 15 or undesirable extension of the distance between the edge 49 and the movable blind 15, can be avoided. By making the distance between the edge 49 and the movable blind 15 small, it is assured that the light interception is carried out at a position very close to the plane, which is defined by the movable blind, being conjugate with the mask. Therefore, the illuminance non-uniformness adjustment is easier.

Although FIG. 10 shows an example wherein two light blocking devices are disposed above and below the light path, only one may be provided above or below the light path. However, using upper and lower light blocking devices as shown in FIG. 10 is preferable in that, as compared with a case wherein only one is used, the deformation stroke for the illumination-light opening can be doubled. Namely, the amount of illuminance non-uniformness adjustment can be increased thereby.

Although this embodiment is an example wherein the light blocking device is disposed adjacent to the movable blind 15, which is placed at an optical imaging position, if an additional imaging position can be defined anywhere separate from the movable blind, the light blocking device 16 may be disposed there.

Second Embodiment

Figure 3:
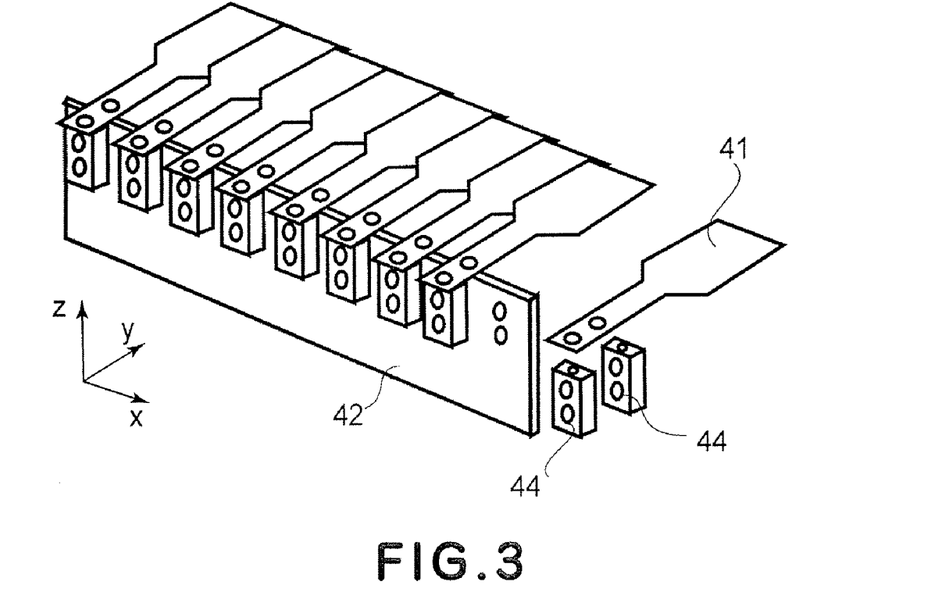
FIG. 3 is a schematic view for explaining the manner of connecting a base plate to driving means.
Figure 4:
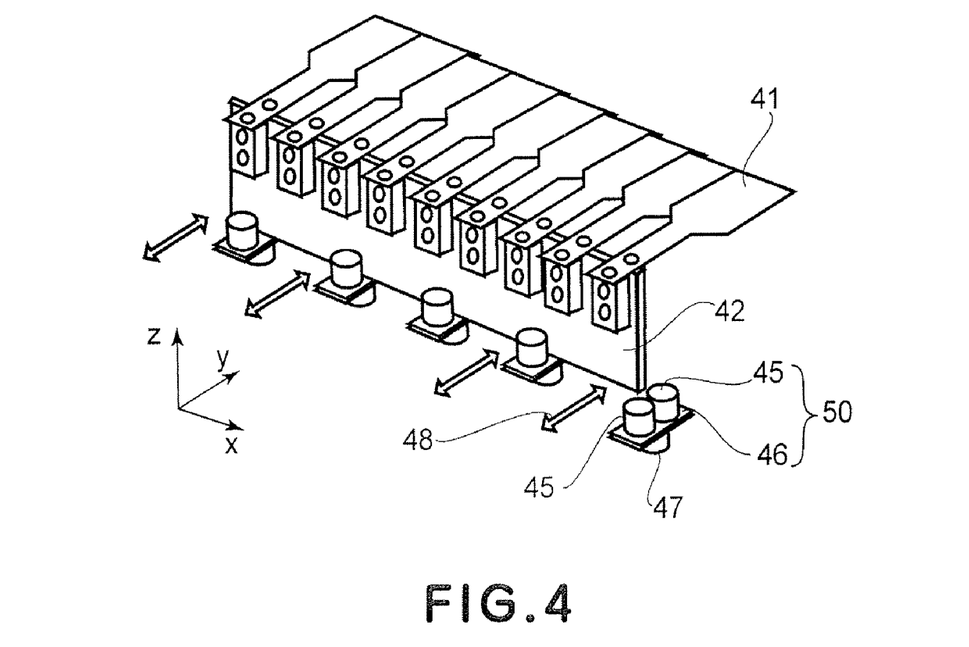
FIG. 4 is a schematic view for explaining the structure of a light blocking device according to a second embodiment of the present invention.
Figure 5:
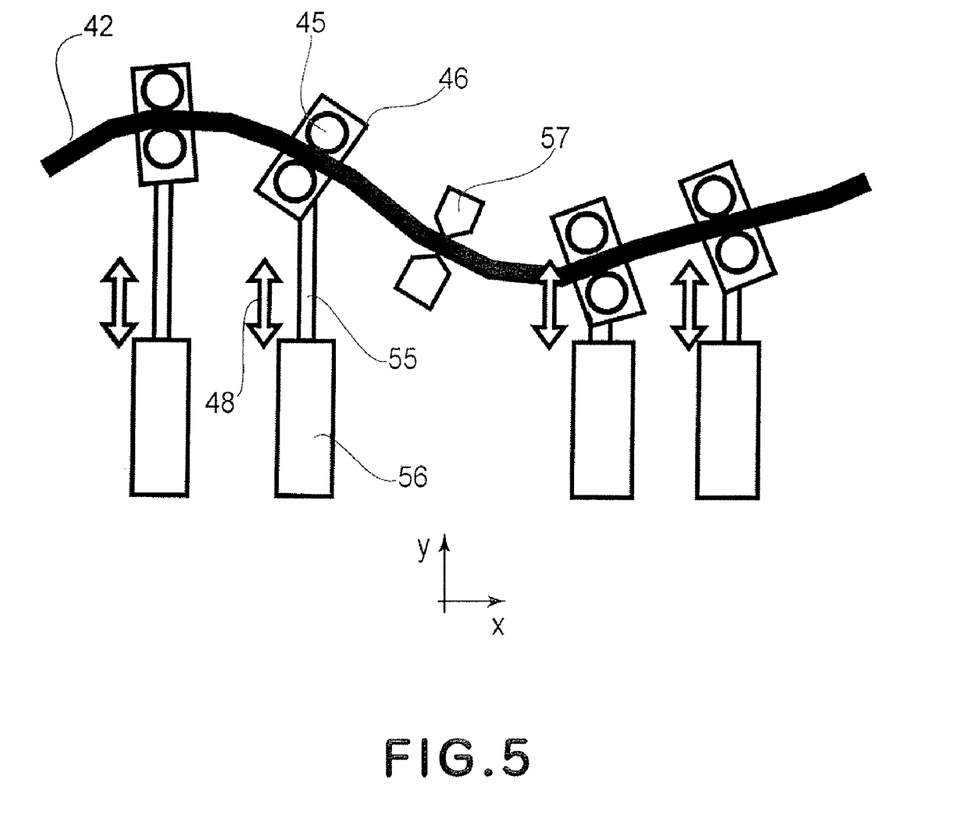
FIG. 5 is a schematic view for explaining the driving method of the light blocking device of FIG. 3.

FIGS. 3, 4 and 5 show a light blocking device according to a second embodiment of the present invention. As one feature, this embodiment differs from the first embodiment in that the light blocking plates 41 are connected to a base plate (plate-like member) 42. This base plate has a thickness direction which lies in the Y direction, and it is deformable in the Y direction. Namely, the rigidity in the Y direction is made larger than that in the X and Y directions.

As another feature, this embodiment differs from the first embodiment in regard to the connector between each actuator 56 and the base member 42 and the connector between each light blocking plate 41 and the base member 42. With regard to structural components of this embodiment not particularly described in the following part of the specification, this embodiment has similar features as those of the first embodiment, unless stated otherwise.

A roller unit (connectors) 50 is connected to the actuator 56 through a stay 55 and a shaft (output member) 47. The roller unit 50 includes at least one pair of rollers 45 and a fixing plate 46 for fixing the rollers 45. The fixing plate 46 is made rotatable around the axis of the shaft 47. The pair of rollers 45 are fixed to the fixing plate 46 so that the interspace between these rollers becomes approximately equal to the thickness of the base plate 42. By nipping the base plate 42 between these paired rollers, the actuator 56 and the base plate 42 are connected to each other. The shape of roller 45 is not limited to this. For example, the roller may be elongated in the Z-axis direction, or plural rollers may be arrayed along the Z-axis direction. On that occasion, the Z-axis position of the light blocking plate 41 comes close to the Z-axis position of the contact between the roller and the base plate 42, and hence, the position adjustment of the light blocking plate 41 becomes easier.

With the structure described above, the base plate 42 is placed unconfined with respect to a direction different from the actuator driving direction (Y direction). In other words, the output members of the actuator and the base plate 42 are made relatively movable in a direction different from the driving direction. As a result of this, even if the base plate 42 deviates in a direction different from the driving direction, no unwanted force is applied to the stay 55 or the actuator 56. Furthermore, it is assured that the base plate 42 is moved in the driving direction by an amount corresponding to the movement distance of the output member of the actuator 56. Here, the direction different from the driving direction may be a direction orthogonal to the driving direction, for example.

The light blocking plates 41 are connected to the base plate 42 through connectors 44. Each connector 44 is connected to the base plate 42 by a screw or bolt means, for example. Each light blocking plate 41 is connected to the connector 44 by a screw or bolt means, for example.

In this embodiment, as in the first embodiment, the light blocking plates are so mounted that adjoining light blocking plates partially overlap with each other. To this end, for example, the width of the edge 49 of each light blocking plate 41 may be made larger than the interspace of the connectors in the X direction.

Here, a sensor may be provided separately to detect the actuator driving amount or the base member 42 position, for precisely controlling the shape of the base plate 42. In this embodiment, the actuator shaft is disposed just underneath the middle point between the paired rollers and, by detecting the driving amount of each actuator 42, the Y-axis position of the base plate 42 at each connector position is detected.

It should be noted that the method of connecting the actuator and the base plate in this embodiment or the position detecting method described above will have similar advantageous effects even if the base plate is replaced by a wire.

Third Embodiment

Figure 6:
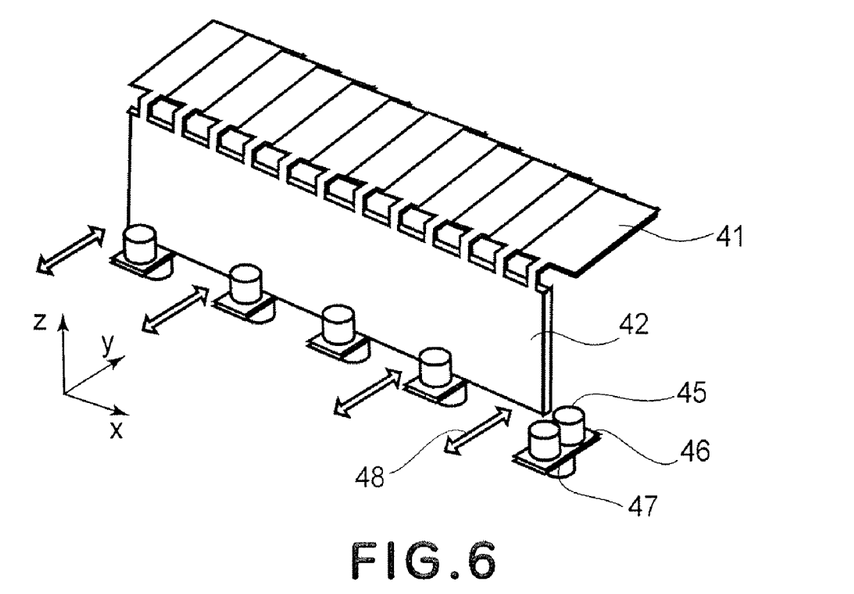
FIG. 6 is a schematic view for explaining the structure of small light blocking plates and a base plate in a light blocking device according to a third embodiment of the present invention.
Figure 7:
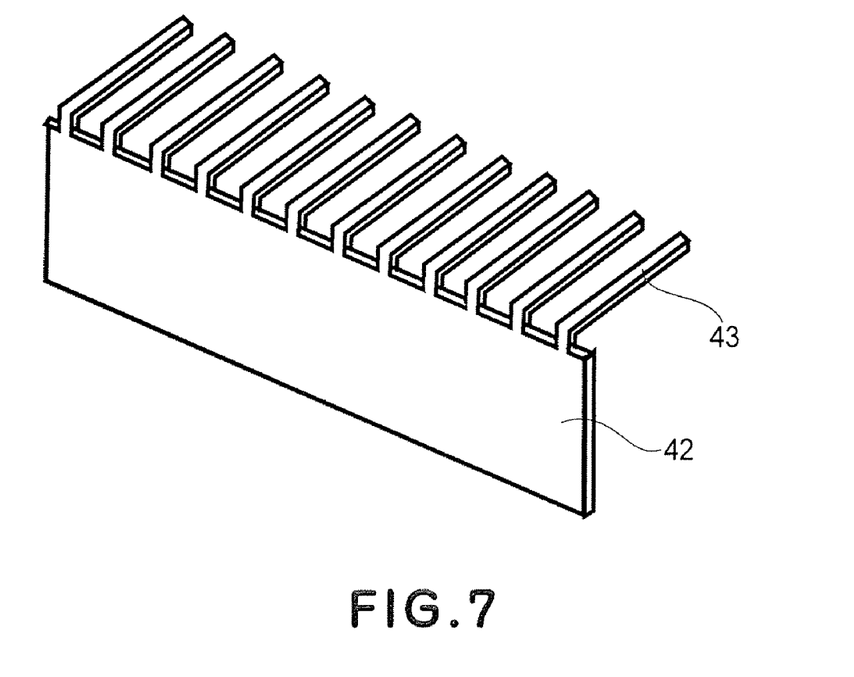
FIG. 7 is a schematic view for explaining the structure of the base plate in the third embodiment of the present invention.

FIGS. 6 and 7 show a light blocking device according to a third embodiment of the present invention. As one feature, this embodiment differs from the second embodiment with respect to the method of connecting the light blocking plate 41 and the base plate 42. With regard to structural components of this embodiment not particularly described in the following part of the specification, this embodiment has similar features as those of the second embodiment, unless stated otherwise.

In this embodiment, one side of the base plate 42 is shaped into a comb-teeth-like shape, and this comb-teeth portion is bent by about ninety degrees relative to the main body of the base plate 42, thereby to form the connectors 43 (see FIG. 7). The light blocking plates 41 are connected to these connectors 43 by fastening using screw or bolt means or by adhesion, for example. Adjoining light blocking plates 41 are disposed partially overlapping, as in the first and second embodiments.

Fourth Embodiment

Figure 8:
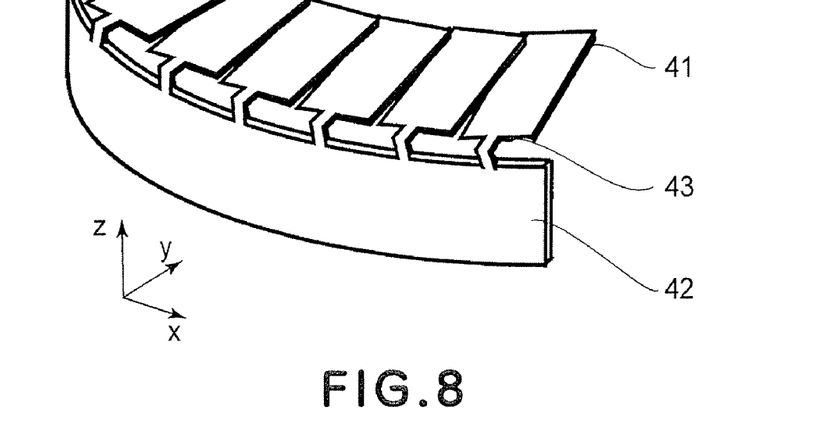
FIG. 8 is a schematic view for explaining the structure of a light blocking device according to a fourth embodiment of the present invention.

FIG. 8 shows a light blocking device according to a fourth embodiment of the present invention. As one feature, the fourth embodiment differs from the preceding embodiments in that a portion of the base plate 42 defines light blocking plates. Here, one side of the base plate 42 is bent by approximately ninety degrees relative to the main body of the base plate 42, and light blocking plates 42 are formed in this bent portion. With regard to structural components of this embodiment not particularly described in the following part of the specification, this embodiment has similar features as those of the second embodiment, unless stated otherwise.

Furthermore, in order to assure that adjoining light blocking plates partially overlap with each other, the base plate 42 is so formed that it has a concave-curved (inwardly curved) shape, not a straight shape, when no force is applied thereto. With this structure, the base plate 42, connectors 43 and light blocking plates 41 can be formed integrally out of a single plate member.

Even if the base plate 42 is made straight, light blocking plates 41 can still be provided by bending one side of the base plate 42 by approximately ninety degrees relative to the main body of the base plate 42. On that occasion, a light blocking plate 41 according to one of the first to third embodiments may be connected, by screwing or adhesion, to between adjoining light blocking plates 41 defined by bending the base plate. For example, the connectors 43 of FIG. 5 and the light blocking plates 41 of FIG. 8 may be disposed alternately, and the light blocking plate 41 may be fixed to the connectors 43.

Embodiment of a Microdevice Manufacturing Method

Next, referring to FIGS. 13 and 14, an embodiment of a microdevice manufacturing method, which uses an exposure apparatus having a light blocking device described above, will be explained.

FIG. 13 is a flow chart for explaining the procedure of manufacturing various microdevices, such as semiconductor chips (e.g., ICs or LSIs), liquid crystal panels or CCDs, for example. Here, an example of semiconductor chip production will be explained. Step 1 is a design process for designing a circuit of a semiconductor device. Step 2 is a process for making a mask on the basis of the circuit pattern design. Step 3 is a process for preparing a wafer by using a material such as silicon. Step 4 is a wafer process, which is called a pre-process, wherein, by using the thus prepared mask and wafer, a circuit is formed on the wafer in practice, in accordance with lithography. Step 5 subsequent to this is an assembling step, which is called a post-process, wherein the wafer having been processed at step 4 is formed into semiconductor chips. This step includes an assembling (dicing and bonding) process and a packaging (chip sealing) process. Step 6 is an inspection step wherein an operation check, a durability check, and so on, for the semiconductor devices produced by step 5, are carried out. With these processes, semiconductor devices are produced, and they are shipped (step 7).

Figure 14:
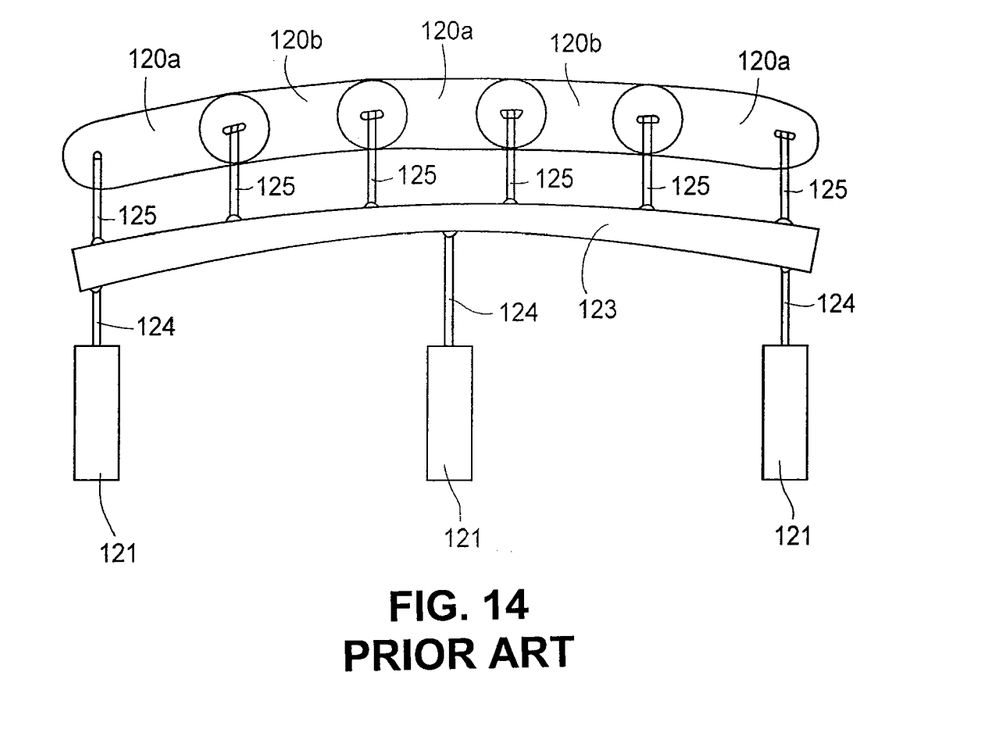
FIG. 14 is a schematic view for explaining a light blocking device disclosed in Japanese Laid-Open Patent Application No. 2002-184676.

FIG. 14 is a flow chart for explaining details of the wafer process. Step 11 is an oxidation process for oxidizing the surface of a wafer. Step 12 is a CVD process for forming an insulating film on the wafer surface. Step 13 is an electrode forming process for forming electrodes upon the wafer by vapor deposition. Step 14 is an ion implanting process for implanting ions to the wafer. Step 15 is a resist process for applying a resist (photosensitive material) to the wafer. Step 16 is an exposure process for printing, by exposure, the circuit pattern of the mask on the wafer through the exposure apparatus described above. Step 17 is a developing process for developing the exposed wafer. Step 18 is an etching process for removing portions other than the developed resist image. Step 19 is a resist separation process for separating the resist material remaining on the wafer after being subjected to the etching process. By repeating these processes, circuit patterns are superposedly formed on the wafer.

While the invention has been described with reference to the structures disclosed herein, it is not confined to the details set forth and this application is intended to cover such modifications or changes as may come within the purposes of the improvements or the scope of the following claims.

This application claims priority from Japanese Patent Applications Nos. 137684/2006 and 124689/2007 filed May 17, 2006 and May 9, 2007, respectively, which are hereby incorporated by reference.

What is claimed is:

1. A light blocking device comprising:
a deformable member being deformable in a first direction and elongating in a second direction intersecting with the first direction;
a plurality of light blocking plates arrayed along the second direction, each of said plurality of light blocking plates being connected to said deformable member so that adjoining blocking plates of said plurality of light blocking plates partly overlap with each other; and
a plurality of actuators being (i) arrayed along the second direction, (ii) configured to cause deformation of said deformable member and (iii) connected with each other only through said deformable member,
wherein at least one of said plurality of light blocking plates is tiltable independently from the other light blocking plates, in response to deformation of said deformable member, to define a light blocking region based on edges of said plurality of light blocking plates.

2. A light blocking device according to claim 1, wherein each of said plurality of light blocking plates is connected to said deformable member through a connector, and wherein an interspace is defined between connectors of adjoining light blocking plates of said plurality of light blocking plates.

3. A light blocking device according to claim 1, wherein said deformable member comprises a line material.

4. A light blocking device according to claim 1, wherein said deformable member comprises a plate-like member having a thickness direction corresponding to the first direction.

5. A light blocking device according to claim 2, wherein each of said plurality of actuators has an output member connected to said deformable member by a second connector, and wherein a respective second connector connects said deformable member and a corresponding output member, so that said deformable member and the corresponding output member are relatively movable, relative to each other in a direction different from a driving direction of a corresponding actuator.

6. A light blocking device according to claim 1, wherein the first direction corresponds to a driving direction of said actuators.

7. A light blocking device according to claim 1, wherein the first direction is substantially perpendicular to an optical axis of light to be blocked.

8. An exposure apparatus comprising:
an illumination optical system configured to illuminate an original with a slit-like light beam, in a scanning direction;
a projection optical system configured to project an image of the original onto a substrate to be exposed;
scanning means configured to relatively scan the original and the substrate, relative to said illumination optical system and said projection optical system; and
a light blocking device as recited in claim 1, which is configured to change a shape of at least one of a leading edge and a trailing edge of the slit-like light beam with respect to the scanning direction of the slit-like light beam.

9. A microdevice manufacturing method comprising:
a step of exposing a substrate by use of an exposure apparatus as recited in claim 8;
a step of developing the exposed substrate; and
a step of processing the developed substrate to manufacture the microdevice.

10. A light blocking device comprising:
a deformable member being deformable in a first direction and elongating in a second direction intersecting with the first direction;
a plurality of light blocking plates arrayed along the second direction, each of said plurality of light blocking plates being connected to said deformable member so that adjoining light blocking plates of said plurality of light blocking plates partly overlap with each other; and
a plurality of actuators arrayed along the second direction and configured to cause deformation of said deformable member,
wherein
(i) said plurality of actuators and said plurality of light blocking plates are so disposed that an interval between adjoining actuators of said plurality of actuators is greater than an interval between adjoining light blocking plates of said plurality of light blocking plates,
(ii) said plurality of actuators are connected with each other only through said deformable member, and
(iii) at least one of said plurality of light blocking plates is tiltable independently from the other light blocking plates, in response to deformation of said deformable member, to define a light blocking region based on edges of said plurality of light blocking plates.

* * * * *